United States Patent [19]

Svedberg

[11] 4,331,884
[45] May 25, 1982

[54] TWO-POLE OVERCURRENT PROTECTION DEVICE

[75] Inventor: Per Svedberg, Vällingby, Sweden

[73] Assignee: ASEA Aktiebolag, Vesteras, Sweden

[21] Appl. No.: 131,564

[22] Filed: Mar. 19, 1980

[30] Foreign Application Priority Data

Apr. 3, 1979 [SE] Sweden .................................. 7902932

[51] Int. Cl.³ ........................................... H03K 17/72
[52] U.S. Cl. ............................ 307/252 C; 307/252 T; 307/305; 357/23; 357/38; 357/39; 361/91
[58] Field of Search ............ 307/252 A, 252 B, 252 C, 307/252 T, 252 N, 305, 200 A; 357/38, 39, 23; 361/91

[56] References Cited

U.S. PATENT DOCUMENTS 3,263,128 7/1966 White ........................... 307/252 C
4,091,434 5/1978 Suzuki et al. ................... 361/100
4,224,634 9/1980 Svedberg ............................. 357/38
4,244,000 1/1981 Ueda et al. .......................... 357/39

Primary Examiner—John Zazworsky
Attorney, Agent, or Firm—Pollock, VandeSande & Priddy

[57] ABSTRACT

A two-pole overcurrent protection device, intended for connection into a current-carrying conductor, comprises a normally conducting thyristor having members for firing the thyristor at low off-state voltage. The thyristor has a member for turning off the thyristor by short-circuiting one of its injecting junctions. Voltage-sensing members sense the on-state voltage drop across the thyristor and influence the short-circuiting member for turning off the thyristor when the on-state voltage drop reaches a pre-determined level. The overcurrent protection device may be constructed integrally with one single semiconductor plate.

10 Claims, 6 Drawing Figures

TWO-POLE OVERCURRENT PROTECTION DEVICE

TECHNICAL FIELD

This invention relates to a two-pole overcurrent protection device for connection into a current-carrying conductor.

In, for example, telephone equipment and other low current equipment there is a need of an overcurrent protection device which is inexpensive and simple and which, contrary to, for example, fuses, is operable again immediately after the termination of the overcurrent without requiring any restoration operation. The present invention aims to provide such an overcurrent protection device.

DISCLOSURE OF INVENTION

According to the invention, a two-pole overcurrent protection device for connection into a current-carrying conductor, comprises a normally conducting thyristor provided with turn-off means as well as voltage-sensing members arranged to sense the voltage across the thyristor, and, when said voltage exceeds a predetermined level, to influence short-circuiting members for turning off the thyristor by short-circuiting at least one of the injecting PN-junctions of the thyristor.

BRIEF DESCRIPTION OF DRAWINGS

The invention will now be described, by way of example, with reference to the accompanying drawings, in which.

DESCRIPTION OF PREFERRED EMBODIMENTS

Figure 1:
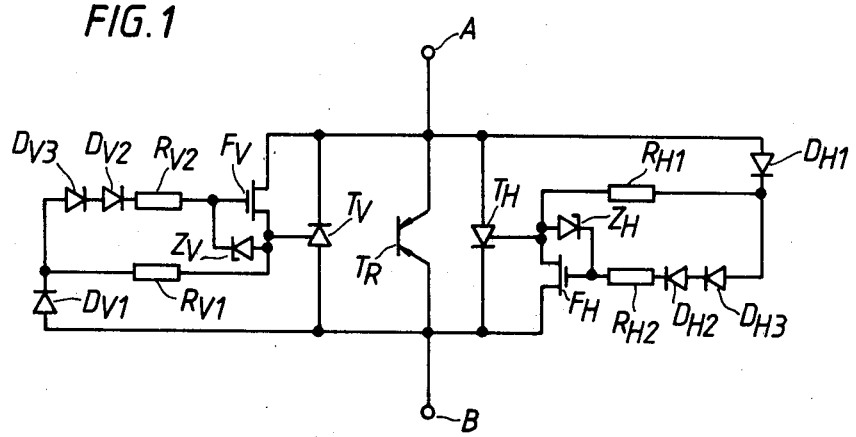
FIG. 1 shows an equivalent diagram, built up of symbols for discrete components, of an overcurrent protection device in accordance with the invention.

The two-pole overcurrent protection device shown in FIG. 1 is intended to be connected into a conductor, for example a lead to an object to be protected against overcurrent. For this purpose, the protection device has two connection terminals A and B. Between these are positioned the two main components of the protection device, namely the anti-parallel-connected thyristors $T_H$ and $T_V$. In undisturbed operation, these thyristors are conducting, the thyristor $T_H$ for the current direction A-B and the thyristor $T_V$ for the opposite current direction, said thyristors conducting the normal operating current with a low voltage drop. Each thyristor is provided with a control circuit.

The control circuit for the thyristor $T_H$ comprises a diode $D_{H1}$ and a resistor $R_{H1}$ which are connected in series with each other from the anode of the thyristor to its control gate. The resistance of the resistor is chosen so that the thyristor is supplied with a control current of an appropriate magnitude as soon as the anode voltage becomes positive, the thyristor thus becoming conducting and carrying current with a low voltage drop.

Between the control gate and the cathode of the thyristor there is connected a normally non-conducting field effect transistor $F_H$ of MOSFET type. The control gate of the transistor is connected to the anode of the thyristor via a resistor $R_{H2}$, two series-connected diodes $D_{H2}$ and $D_{H3}$ and the diode $D_{H1}$. A protective diode $Z_H$ of Zener type is connected between the control gate of the transistor and the control gate of the thyristor and prevents the control voltage of the transistor from exceeding the Zener voltage of the diode. The resistor $R_{H2}$ has a resistance which limits the current to a harmless value when the diode $Z_H$ is conducting.

The control circuit of the thyristor $T_V$ is identical with the control circuit of the thyristor $T_H$, with the only difference that the components in the Figure have been provided with indices "V" instead of "H".

A "transistor portion" TR is connected in parallel with the thyristors. It is designed so as to divert the minority charge carriers in one base layer of the thyristor, the number of said minority charge carriers increasing with increased thyristor current (see further below). This results in a reduced current amplification of one transistor section of the thyristor and a voltage drop across the conducting thyristor which increases rapidly at currents above a certain value. When the voltage across the thyristor becomes equal to the sum of the on-state voltage drops of the three diodes (e.g. $D_{H1}$, $D_{H2}$ and $D_{H3}$) and the threshold voltage of the MOS transistor ($F_H$), the transistor becomes conducting. The control gate of the thyristor is thus short-circuited to the cathode of the thyristor and the thyristor current is shunted past the injecting cathode-emitter junction of the thyristor, the total current amplification of the thyristor then being reduced to such an extent that the thyristor becomes non-conducting.

A conventional thyristor has an on-state voltage drop which increases slowly with the load current and approximately proportionally thereto. The voltage across such a thyristor is therefore an unprecise measure of the thyristor current, and when using such a thyristor in an overcurrent protection device in accordance with the invention it is therefore difficult to obtain a well-defined turn-off current level. According to a preferred embodiment of the invention, the thyristor is therefore provided with members providing a rapid increase of the on-state voltage drop of the thyristor at the current level at which the overcurrent protection device shall react. These members may consist of the above-mentioned transistor section TR, or they may be constructed in a different way.

Figure 2:
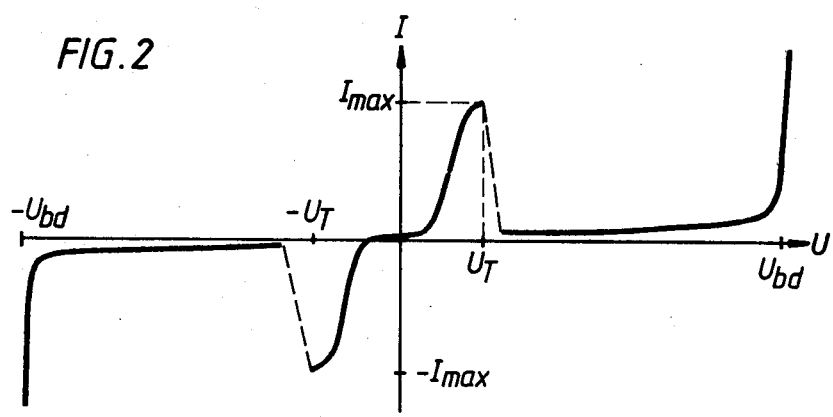
FIG. 2 is a graph of the current-voltage characteristic of the protection device of FIG. 1.

FIG. 2 shows the current-voltage characteristic of the overcurrent protection device. The first quadrant of the diagram applies, for example, when the thyristor $T_H$ is conducting and its third quadrant when the thyristor $T_V$ is conducting. With increasing current I, the voltage U across the thyristor first increases relatively slowly. When I approaches the limit current $I_{max}$ of the protection device, the thyristor voltage U starts increasing more and more rapidly because of the charge carrier diverting effect of the transistor section TR. When the current has reached the value $I_{max}$ and the voltage has reached the value $U_T$, the thyristor is turned off in the manner described above as the transistor ($F_H$) becomes conducting. The thyristor current then drops to a very low value (the off-state current of the thyristor), whereas the voltage U will rise to a value determined by the circuit into which the protection device is connected. The thyristors in the protection device are dimensioned such that their breakdown voltage $U_{bd}$ with a suitable margin exceeds the highest voltage to which the protection device may be estimated to be subjected in the circuit or equipment for which the protection device is designed.

Figure 3:
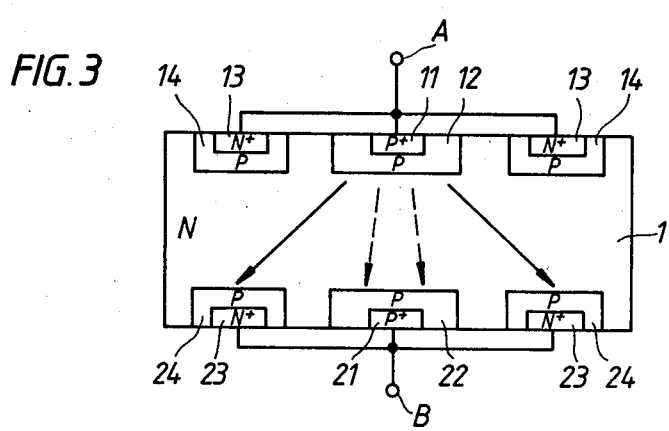
FIG. 3 shows schematically the fundamental construction and function of the protection device.

FIG. 3 shows how the two thyristors $T_H$ and $T_V$ and the transistor section TR are formed in a plate of semiconducting material, preferably silicon. The plate has a basic doping of N-type, and this N-doped portion 1 of the plate constitutes the N-base of the thyristors as well as of the transistor section.

Centrally at the upper surface of the plate there are arranged a P-doped layer 12 and inside it a P+-doped layer 11. Around these layers there is arranged a P-conducting annular layer 14 with an N+-doped annular layer 13 inside it. At the lower surface of the plate, the layers 21–24 are arranged in the same way as the layers 11–14 on the upper surface of the plate. The layers 11 and 13 are connected to the connection terminal A and the layers 21 and 23 are connected to the terminal B.

By "P+-doped" (P+-conducting) layer is meant a layer with a stronger doping than a "P-doped" (P-conducting) layer, and the corresponding applies to an "N+-doped" and "N-doped" layer.

The thyristor $T_H$ is formed by the layers 11, 12, 1, 24 and 23. When the thyristor is conducting, the current flows laterally through layer 1 from layer 12 to layer 24, which is shown by unbroken arrows in the Figure. This current consists essentially of minority charge carriers injected from layer 12 into layer 1, that is, holes.

The transistor section TR consists of the layers 11, 12, 1, 22, 21 and is thus of PNP type. At a low current through the thyristor $T_H$, the lower PN junction (between layers 22 and 1) of the transistor section is not blocked or slightly injecting. None, or only a few, of the holes injected from layer 12 into layer 1 are then sucked up by the junction. When the current through the thyristor increases, the on-state voltage drop therein increases, and as a result of the increased voltage an increasing reverse blocking voltage is applied to the junction 1–22 which sucks up an increasing proportion of the holes injected into the layer 1 (broken arrows in the Figure). The current amplification of the PNP section of the thyristor $T_H$ then decreases and the thyristor becomes less saturated, which tends to increase the on-state voltage across the thyristor further. This results in the rapid increase of the thyristor voltage, shown in FIG. 3, when the current approaches the limit value $I_{max}$.

The limit value $I_{max}$ may be set by a suitable choice of the carrier life time in the layer 1 in relation to the inner radius of the peripheral P-layer 14 and to the thickness of the N-base layer 1.

Because the layer 11 with high injection is arranged centrally in the plate, a substantially laterally operating PNP transistor section of the thyristor $T_H$ is obtained, and this results in the mode of operation as described above.

The thyristor $T_V$ consists of layers 21, 22, 1, 14, 13 and operates in a manner corresponding to what has been described above with reference to the thyristor $T_H$.

An overcurrent protection device of the kind described, intended, for example, for telephone equipment, may be constructed for a limit current of, for example, 200–400 mA and a breakdown voltage of 1000 V or more. The turn-off voltage ($U_T$ in FIG. 2) may be set at a suitable value, for example one or a few volts, by selecting the number of diodes connected in series with the resistor $R_{H2}(R_{V2})$ in FIG. 1. FIG. 1 shows two diodes, $D_{H2}$ and $D_{H3}$ ($D_{V2}$ and $D_{V3}$), but the number may be greater or smaller.

The overcurrent protection device in accordance with the invention has been found to be very fast and interrupts an overcurrent in some ten to thirty μs.

An overvoltage arriving at the equipment normally causes an overcurrent in the conductor or conductors on which the overvoltage enters. An overcurrent protection device in accordance with the invention may therefore be used as an overvoltage protection device and may replace previously used devices of this kind.

Figure 4A:
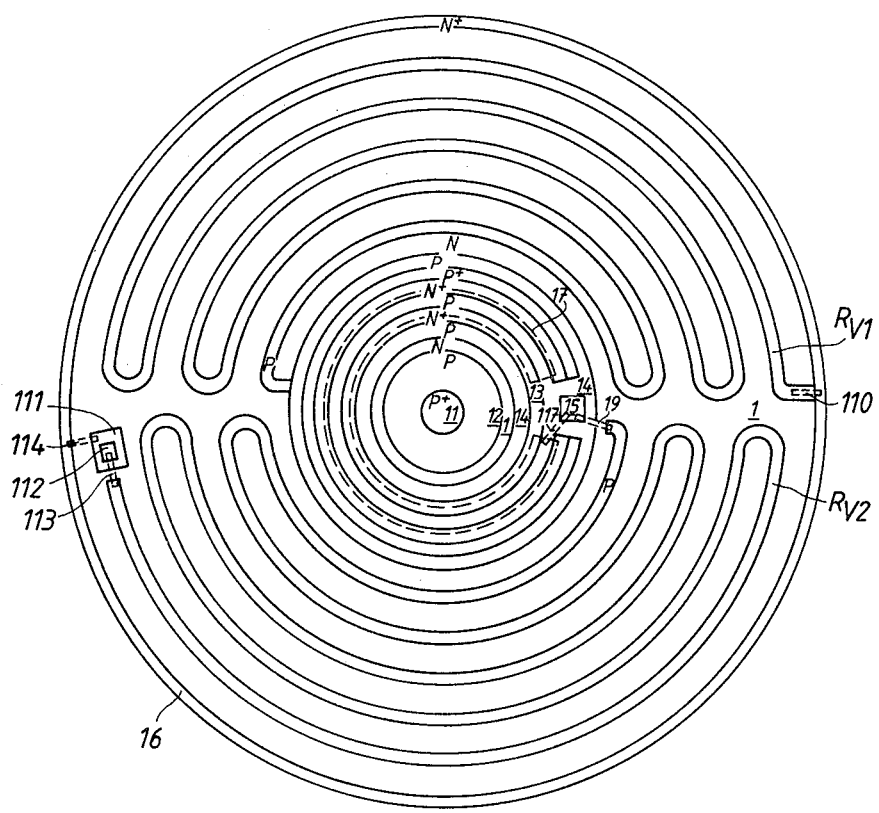
FIG. 4a is a plane and FIG. 4b a sectional view showing in more detail the construction of the protection device.
Figure 4B:
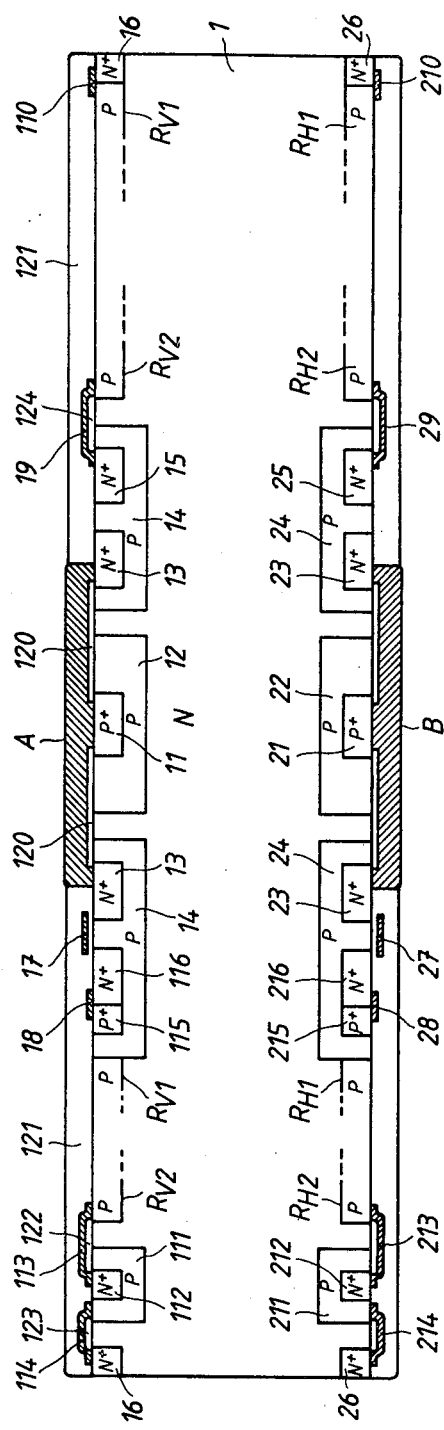

For the sake of clarity, the control circuits shown in FIG. 1 are not shown in FIG. 3. They are suitably made integral with the same semiconductor body as the thyristors and the transistor section. FIGS. 4a and 4b show an example of how this may be accomplished. The protection device according to FIGS. 4a and 4b is constructed in the same way as the device shown in FIG. 3. The upper and lower parts of the semiconductor plate are indentical and the plate is circular-symmetrical in the same way as that shown in FIG. 3. FIG. 4a shows one of the plane surfaces of the plate with the boundaries between the zones of the plate as well as some of the connections arranged on the surface. FIG. 4b shows a section through the plate. In the following only the design of the upper surface of the plate will be described. On this surface are formed the components belonging to the control circuit for the thyristor $T_V$, whereas the control circuit of the thyristor $T_H$ is formed on the lower surface of the plate.

The zones 1, 11–14 shown in FIG. 3 are to be found in FIGS. 4a and 4b (and in FIG. 4b also layers 21–24). The layers 13 and 14 are annular and surround the central layers 11 and 12. A circular metallic contact A (not shown in FIG. 4a) makes contact with the layers 11 and 13 and serves as one connection of the overcurrent protection device. The contact is insulated from the layers 12, 1, 14 by an underlying silicon dioxide layer 120. Outside the layer 13 there is formed in layer 14 an N+-doped layer 116 and a P+-doped layer 115 arranged adjacent the layer 116. Said two layers are annular with the exception of a sector (at the right-hand side in FIGS. 4a and 4b) where the Zener diode $Z_V$ is formed. An electrical contact 18 (not shown in FIG. 4a), for example of platinum silicide, bridges the junction between the layers 115 and 116. On the surface there is arranged an insulating silicon dioxide layer 121, and in this the control means 17 of the MOS transistor $F_V$ is arranged in the form of a layer of metal or polysilicon (dashed lines in FIG. 4a). The transistor consists of the layers 13, 14 and 116. The latter is ohmically connected to the P-base 14 of the thyristor $T_V$ via the contact 18 and the layer 115. When the control means 17 controls the transistor to conducting state, the P-base 114 of the thyristor therefore becomes connected to the N+-emitter 13 of the thyristor through a low impedance ohmic connection. The injecting emitter junction 13–14 thus becomes bridged and the thyristor is turned off.

At the edge of the upper surface of the component there is arranged an annular N+-doped zone 16. This zone constitutes the common point (see FIG. 1) for the diode $D_{V1}$, the resistor $R_{V1}$ and the diode connection $D_{V2}$–$D_{V3}$. The diode $D_{V1}$ consists of the anode-emitter junction (22-1) of the thyristor $T_V$. The resistor $R_{V1}$ consists of a narrow and elongate P-doped layer at the surface of the plate. At the left-hand side of FIGS. 4a and 4b, the resistor is connected to the P-base layer 14 of the thyristor. At the right-hand side of FIGS. 4a and 4b, the resistor is ohmically connected to the layer 16 by means of a contact 110.

The Zener diode $Z_V$ consists of the layer 14 and the N+-doped layer 15 formed in the right-hand part thereof. The latter layer is electrically connected to the control gate 17 of the transistor $F_V$ via a contact 117 (FIG. 4a). The resistor $R_{V2}$ consists of an elongate P-doped layer at the surface of the plate in the same way as the resistor $R_{V1}$. At its inner end (the right-hand side of the Figures) the resistor is ohmically connected to the layer 15 (and thus to the control means 17) via a contact 19 arranged on the insulating layer 124.

At its outer end (the left-hand side of FIGS. 4a and 4b) the resistor $R_{V2}$ is connected to the edge zone 16 via the diode connection ($D_{V2}$-$D_{V3}$ in FIG. 1). For the sake of clarity, the diode connection is shown with one diode only. This consists of the junction between the P-doped layer 111 and the N+-doped layer 112 formed therein. The outer end of the resistor $R_{V2}$ is connected to the cathode layer 112 of the diode through a contact 113 arranged on the insulating layer 122. The anode layer 111 of the diode is connected to the edge zone 16 through a contact 114 arranged on the insulating layer 123.

Of course, additional diodes may be arranged in series in an arbitrary number, and they may then, for example, be formed in a row one after the other around the periphery of the plate.

The control circuits for the thyristor $T_H$ formed at the lower surface of the plate have the same configuration as has been described above. In FIG. 4b they are provided with the same reference numerals, however with the first numeral one replaced with the numeral two. The anode contact of the thyristor $T_H$ consists of the metal layer B in FIG. 4b.

As is clear from FIG. 4a, the resistors $R_{V1}$ and $R_{V2}$ are arranged so as to form a pattern covering the surface between the central part of the plate and its edge part, and so that the potential successively decreases or increases from the central part out towards the edge part. This results in an efficient control of the potential on the surface of the plate, located stresses are avoided and the voltage endurance of the component is improved. Of course, it would be possible to use other patterns than that shown in FIG. 4a. For example, the resistors $R_{V1}$ and $R_{V2}$ may be formed as two coils running inside each other between the central part of the plate and its edge.

Figure 5:
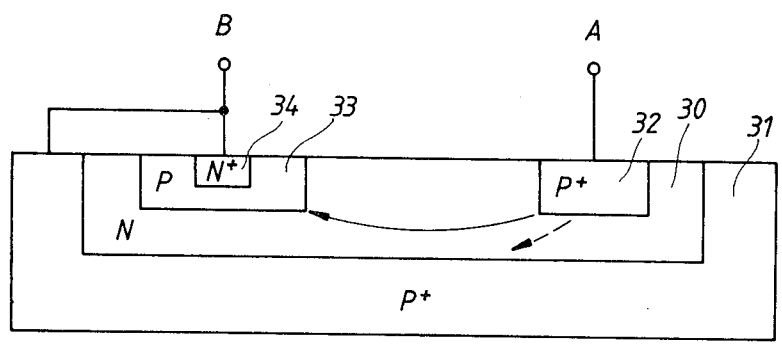
FIG. 5 shows schematically an alternative form of a protection device in accordance with the invention.

FIG. 5 shows how an overcurrent protection device in accordance with the invention may be designed in accordance with the planar technique. A semiconductor plate has at the bottom a P+-doped zone 31 and above this an N-doped zone 30. In the latter zone a P+-doped zone 32 is formed, as well as a P-doped zone 33 and an N+-doped zone 34 formed in the zone 33. The zones 31 and 34 are connected to one of the terminals B and the zone 32 is connected to the other terminal A. The zones 32, 30, 33, 34 form the thyristor. When the thyristor is conducting, holes injected from the layer 32 flow through the layer 30 in the direction of the unbroken arrow. The transistor section of the protection device consists of the zones 32, 30 and 31, and at increasing on-state voltage said zones divert an increasing number of the holes (broken arrow) in the same way as has been described with reference to FIGS. 1-4b. In the same way as in FIGS. 4a and 4b, the control circuits may be formed at the upper surface of the plate. FIG. 5 shows a one-way component but it may, of course, be completed, as the one shown in FIGS. 1-4b, so that it is able to carry current in both directions.

The diodes $D_{H2}$ and $D_{H3}$ as well as the diodes $D_{V2}$ and $D_{V3}$ may have reversed polarities and be formed as Zener diodes, which may be suitable if a high operating voltage ($U_T$) in FIG. 2 is desired.

As is clear from the above description, an overcurrent protection device having considerable advantages is obtained in accordance with the invention. Because it is a two-pole protection device, its manufacture, encapsulation and connection into a circuit are simple and inexpensive. The protection device may suitably be designed as a single, relatively simple integrated circuit, the encapsulation of which only needs two lead-throughs and two connecting leads. For some of the applications for which they are intended, for example telephone equipment, a very high number of overcurrent protection devices are included. The simplicity, the low price and the simple connection provided by the protection device in accordance with the invention are therefore of very great importance.

Further, as mentioned above, the overcurrent protection device is always automatically operable immediately after the termination of an overcurrent.

The overcurrent protection device in accordance with the invention may further be given a well-defined and precise turn-off current level, as mentioned above, and provides a very quick-acting and reliable protection against overcurrents.

What is claimed is:

1. A two-pole device for connection into a current-carrying conductor for protecting the conductor from an overcurrent condition, the device comprising: a normally conducting thyristor, and an MOS transistor integrated with the thyristor and connected in parallel with an emitter junction thereof adjacent one of two main thyristor electrodes, a gate of the MOS transistor connected to the other of the main electrodes through voltage sensing members for causing the MOS transistor to conduct when the voltage across the thyristor exceeds a predetermined level, thereby short circuiting the emitter junction and extinguishing the thyristor.

2. An overcurrent protection device according to claim 1, together with transistor means connected across the thyristor for providing a rapid increase of the conducting voltage drop across the thyristor when a pre-determined level of thyristor load current has been reached.

3. An overcurrent protection device according to claim 2 wherein the transistor means comprises a transistor section integrated with the thyristor and parallel-connected to the thyristor, the transistor section having its base layer in common with one of the base layers of the thyristor and being arranged to divert, from said base layer, a fraction of minority charge carriers injected into the base layer, which fraction increases with thyristor voltage.

4. An overcurrent protection device according to claim 3, in which the voltage-sensing members comprise a diode connection, connected between the control gate of the MOS transistor and the common base layer, said diode connection consisting of one or more diodes connected in series with each other and integrated with the thyristor.

5. An overcurrent protection device according to claim 3, together with a first resistor integrated with the thyristor, said resistor being connected between a control layer of the thyristor and the common base layer and being arranged to supply current to the control layer for firing the thyristor.

6. An overcurrent protection device according to claim 6, together with a second resistor which is integrated with the thyristor and connected in series with the diode connection.

7. An overcurrent protection device according to claim 1, together with a second thyristor connected in an anti-parallel configuration, the thyristors integrated with each other, each having voltage sensing and short-circuiting members connected thereto.

8. An overcurrent protection device according to claim 1, in which injecting portions of anode and cathode parts of the thyristor are displaced laterally with respect to each other.

9. An overcurrent protection device according to claim 6, in which the thyristor is formed centrally in one semiconductor plate, and said first resistor is formed in a surface of the plate between the thyristor and an edge of the plate in such a manner that the resistor controls the potential distribution between the thyristor and the edge of the plate.

10. An overcurrent protection device according to claim 8, in which the thyristor is formed centrally in one semiconductor plate, and said second resistor is formed in a surface of the plate between the thyristor and the edge of the plate in such a manner that the resistor controls the potential distribution between the thyristor and the edge of the plate.

* * * * *